(12) United States Patent
Kang et al.

(10) Patent No.: US 8,016,024 B2
(45) Date of Patent: Sep. 13, 2011

(54) LOOP HEAT PIPE WITH FLAT EVAPORTOR HAVING A WICK WITH AN INTERNAL CHAMBER

(75) Inventors: Shung-Wen Kang, Danshuei Township, Taipei County (TW); Meng-Chang Tsai, Babe (TW)

(73) Assignee: Tamkang University, Taipei County (TW)

( * ) Notice: Subject to any disclaimer, the term of this patent is extended or adjusted under 35 U.S.C. 154(b) by 231 days.

(21) Appl. No.: 11/723,419

(22) Filed: Mar. 20, 2007

(65) Prior Publication Data

US 2008/0164010 A1 Jul. 10, 2008

(30) Foreign Application Priority Data

Jan. 9, 2007 (TW) .............................. 96100804 A

(51) Int. Cl.
*F28D 15/00* (2006.01)
(52) U.S. Cl. .............................. 165/104.26; 165/104.21
(58) Field of Classification Search ............. 165/104.21, 165/104.26
See application file for complete search history.

(56) References Cited

U.S. PATENT DOCUMENTS

| | | | | |
|---|---|---|---|---|
| 3,921,710 A * | 11/1975 | Katayama | ................ | 165/104.26 |
| 4,602,679 A * | 7/1986 | Edelstein et al. | ........ | 165/104.26 |
| 5,725,049 A * | 3/1998 | Swanson et al. | ......... | 165/104.26 |
| 5,761,037 A * | 6/1998 | Anderson et al. | ............. | 361/700 |
| 6,564,860 B1 * | 5/2003 | Kroliczek et al. | ....... | 165/104.26 |
| 6,956,740 B2 * | 10/2005 | Shimura et al. | ................ | 361/700 |
| 7,748,436 B1 * | 7/2010 | Anderson et al. | ........ | 165/104.26 |
| 2002/0170705 A1 * | 11/2002 | Cho et al. | .................. | 165/104.26 |
| 2002/0179288 A1 * | 12/2002 | Ishida et al. | ............. | 165/104.26 |
| 2005/0252643 A1 * | 11/2005 | Kroliczek et al. | ........ | 165/104.26 |
| 2006/0162897 A1 * | 7/2006 | Cherng | .......................... | 165/46 |
| 2007/0034358 A1 * | 2/2007 | Lee | ............................ | 165/104.26 |
| 2007/0056714 A1 * | 3/2007 | Wong | ........................ | 165/104.26 |
| 2007/0187072 A1 * | 8/2007 | Chin et al. | ............... | 165/104.26 |
| 2007/0204646 A1 * | 9/2007 | Gagliano | ........................ | 62/389 |
| 2007/0267180 A1 * | 11/2007 | Asfia et al. | ............... | 165/104.26 |
| 2008/0277099 A1 * | 11/2008 | Takamatsu et al. | ...... | 165/104.26 |
| 2008/0283223 A1 * | 11/2008 | Chang et al. | ............. | 165/104.26 |

* cited by examiner

*Primary Examiner* — Cheryl J Tyler
*Assistant Examiner* — Brandon M Rosati
(74) *Attorney, Agent, or Firm* — Rosenberg, Klein & Lee

(57) ABSTRACT

A loop heat pipe with flat evaporator includes an evaporation section, a condensation section, and a transportation section connected between the evaporation section and the condensation section. The evaporation section includes a heat source, an enclosed containment structure, and a capillary structure. The enclosed containment structure is positionable on the heat source and forms an enclosed containment space which receives a working fluid and has a bottom in which a channel structure is formed and further forms a liquid inlet and a gas outlet in a circumferential wall thereof the container to respectively connect a liquid passage and a gas passage so that when the working fluid is heated by the heat source to become vapor, the vapor moves through the gas outlet and the gas passage to a condensing device provided in the condensation section where the vapor is cooled and converted back to the liquid form of the working fluid that is then guided through the liquid passage back to the enclosed containment space for next cycle.

8 Claims, 6 Drawing Sheets

LOOP HEAT PIPE WITH FLAT EVAPORTOR HAVING A WICK WITH AN INTERNAL CHAMBER

FIELD OF THE INVENTION

The present invention relates to a loop heat pipe, and in particular to a loop heat pipe with a flat evaporator.

BACKGROUND OF THE INVENTION

With the development of semiconductor related techniques, the number of leads in a semiconductor chip is continuously increased. To accommodate the increased number of leads, the surface area of a packaged semiconductor device is often several times of the related die area. Thus, heat flux on the surface of a package is generally distributed in a non-uniform manner, and hot spots are easily formed. This makes the thermal stress distribution non-uniform and causes damage to the semiconductor chip. Heat pipe is one of the most powerful way to remove heat from a heat-generating device to a heat dissipation device, and heat is dissipated at the heat dissipation device. One of the most common applications of the heat pipe is the electronic devices, such as a notebook computer.

The currently known modes of heat dissipation include: (1) forced air-cooling heat dissipation, (2) forced liquid-cooling heat dissipation, (3) heat pipe phase change heat dissipation, (4) thermo-electrical cooling heat dissipation, and (5) refrigeration heat dissipation. The refrigeration heat dissipation is further classified as micro channel heat sink, micro heat exchanger, micro miniature refrigerator, micro heat pipe, and micro jet droplet cooling.

Those heat dissipation modes that are of high costs and consequently high performance may not be fit for computers, which are generally low-cost devices operated at high power. Thus, development of heat dissipation devices featuring low cost, high performance, and low wearing is certainly a future trend of heat dissipation industry and heat pipe based heat dissipation device is one of the candidates for such a trend.

FIG. 1 of the attached drawings shows a schematic view the structure of a conventional heat pipe, which is broadly designated with reference numeral 100. The conventional heat pipe 100 is comprised of a sealed/enclosed container 1, a capillary structure 2, and a working fluid 3. The enclosed container 1 is evacuated and then filled with a proper amount of the working fluid 3. The container 1 has an end 1a, serving as an evaporator, which when subject to heating, causes the working fluid 3 to evaporate as a result of absorption of the heat and vapor 31 is generated. The vapor 31 flows from the evaporation end 1a toward a condensation end 1b (serving as a condenser) of the container 1 to release the heat thereof. The movement of the vapor 31 is driven by pressure difference between the two ends of the container 1, while the condensate 32 of the vapor, which is in a liquid form 32, is conducted in a reversed direction through the capillarity of the capillary structure 2 back to the evaporator end 1a. The heat pipe operates to dissipate heat by the phase change of substance (working fluid), which absorbs and releases a great amount of heat. The heat pipe achieves very high efficiency of heat removal due to the heat transfer effected by the phase change of the working fluid and thus super thermal conduction is realized.

Heat pipes that are used for heat dissipation of electronic devices are often of a small contact with the heat generating parts and the tubular configuration of the heat pipes also impose limitation to the shape of the heat pipe in actual practices. For example, bending and/or flattening both may damage and even completely eliminate the feature of heat transfer of the heat pipe. To overcome such a problem, manufacturers of heat dissipation devices employs phase change in flat plate based heat dissipation device with the purposes of reduction of overall thickness and elimination of the restriction of splashing of the traditional tubular heat pipe. Such as flat plate based heat dissipation device is often referred to as "plate heat pipe". A similar technique has been applied in the field of solar energy and is referred to as loop heat pipe, of which an example is schematically shown in FIG. 2 of the attached drawings, comprising an evaporation end 1a which receives heat to evaporate the working fluid 3 located therein into vapor 31, the vapor 31 being guided through a vapor conduit 11a to a condensation end 1b where heat is released from the vapor 31 and the vapor condenses back to liquid to flow back to the evaporation end 1a through a liquid conduit 11b.

The electronic industry is one of the most prosperous businesses in the world and a great number of new modes or new devices are being developed and marketed. With the performance of the electronic devices being increasingly improved, power consumption is also increased. This leads to accumulation of heat and eventually limits the improvement of the electronic device. Thus, properly installed heat dissipation device to timely remove the heat is a must for the modern electronic industry. The conventional heat dissipation mechanism that is based on fins and fans is apparently insufficient for the modern electronics and heat pipe based heat dissipation device is instead prevailing nowadays. Further, the working fluid e.g. water may spill or leak from the heat pipe and causes the short circuit.

Some of the commonly seen examples of the electronic devices that require high efficiency heat removal include the so-called 3C products (Computers, Communications, and Consumer Electronic Products) and advanced semiconductor devices, such as high power light-emitting diodes (LEDs), lasers, LED arrays, and backlight modules of for example large-sized television sets. To efficiently transfer heat to a condensation zone in order to effectively dissipate heat from a notebook computer, which has a very limited space available for installation of the heat dissipation device, is a critical factor to ensure high performance.

The heat pipe is considered a widely-used high-heat-transfer heat dissipation element for the notebook computer, for it provides, due to the two phase flow occurring therein, a heat transfer capability that is hundreds of times of metals, such as copper, of substantially the same size and is often considered as superconductor for heat.

SUMMARY OF THE INVENTION

Thus, an objective of the present invention is to provide a loop heat pipe with flat evaporator comprising an enclosed zone inside which a working fluid, which changes between liquid and gas phase in response to the change of temperature, is filled in order to provide fast and mass transfer of heat by means of phase change of the working fluid.

Anther objective of the present invention is to provide a miniature loop heat pipe possessing an improved heat transfer efficiency for the need of heat dissipation for future compact/densely arranged electronic devices.

To solve the above discussed problems, the present invention provide a loop heat pipe with flat evaporator comprising an evaporation section, a condensation section, and a transportation section connected between the evaporation section and the condensation section. The evaporation section is arranged to contain a heat source from which heat is to remove therein and also comprises an enclosed containment structure positionable on the heat source. The enclosed containment structure comprises a container closed by a lid to define an enclosed containment space therebetween for receiving a working fluid. The enclosed containment space further comprises a channel structure, a capillary structure, a liquid inlet, and an opposite gas outlet. The channel structure comprises a plurality of channels formed horizontally in a bottom of the enclosed containment space and arranged to be parallel and equally spaced from each other. The capillary structure is horizontally positioned on the channel structure. The liquid inlet, which is formed in a circumferential wall of the container and in communication with the capillary structure, and the gas outlet, which is also formed in the circumferential wall and in communication with the channels of the channel structure, are respectively connected to a liquid conduit and a gas conduit whereby vapor generated by the evaporation of the working fluid is guided outward through the gas outlet and toward a condensing device arranged in the condensation section where the vapor condenses and is converted back to liquid form, the liquid flowing through the liquid conduit back to the enclosed containment space to start the next cycle.

The present invention provides a miniature loop heat pipe with flat evaporator, which can be used in a notebook computer to alleviate the drawback of reducing performance caused by bending of the traditional tubular heat pipe, and also improves the entertainment limit caused by the small size of the heat pipe. Employing flexible conduit in a limited space is advantageous in providing flexibility of use of space inside a notebook computer.

The loop heat pipe of the present invention demonstrates excellent heat removal performance, which is far superior to the conventional water cooling techniques, and does not suffer troubles caused by spillage of water that often damages electronics. Further, the loop heat pipe of the present invention comprises conduits that are extended from a heat source to a remote location so that the drawbacks of incapability of long distance transfer of heat and un-bendability suffered by the conventional heat pipe is completely removed by the present invention. Water would not spill to the heat source device and would not cause the short circuit to the heat source device. Theoretically, thermal performance of the loop heat pipe can be enhanced, as compared to the known devices of the same purposes.

The conventional plate heat pipes are often used in military and/or aerospace applications for their high costs. The present invention provides a loop heat pipe with flat evaporator that is of a compact and modified structure and realizes high capability of heat transfer with reduced costs. The heat pipe device of the present invention has a small size and light weight, which makes the heat pipe device of the present invention suitable for high power electronic devices or semiconductor based light-emitting devices for the purposes of heat removal. The extended conduits allow the heat pipe of the present invention to be deformed and allocated in almost any desired form without being subject to limitation imposed by the limited space inside for example a computer. In addition, the separated liquid and gas passages employed in the heat pipe device of the present invention provides a further advance in the performance of heat transfer, which allows a greater amount of heat to be transferred as compared to the conventional heat pipe devices. Also, the loop heat pipe can be applied in simultaneously removing heat from a variety of heat sources, or simultaneously transferring heat from the heat source to a variety of condensers for enhanced heat dissipation. As a result, the loop heat pipe of the present invention can be used in for example large-sized flat displays that use light-emitting diode (LED) based lighting device as a light source. Another application is natural convection based heat dissipation mechanism for outdoor LED lighting device.

BRIEF DESCRIPTION OF THE DRAWINGS

The present invention will be apparent to those skilled in the art by reading the following description of preferred embodiments thereof, with reference to the attached drawings, in which.

DETAILED DESCRIPTION OF THE PREFERRED EMBODIMENTS

Figure 1:
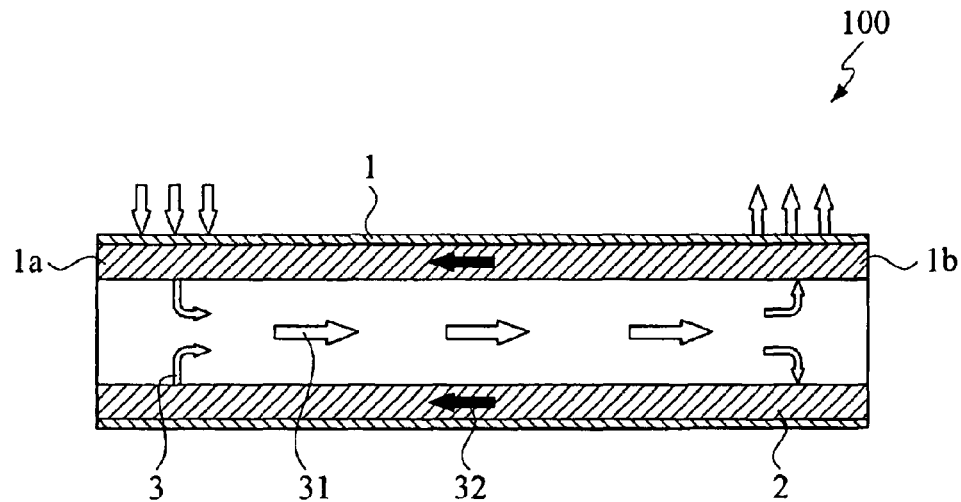
FIG. 1 is a cross-sectional view schematically illustrating a conventional heat pipe.
Figure 2:
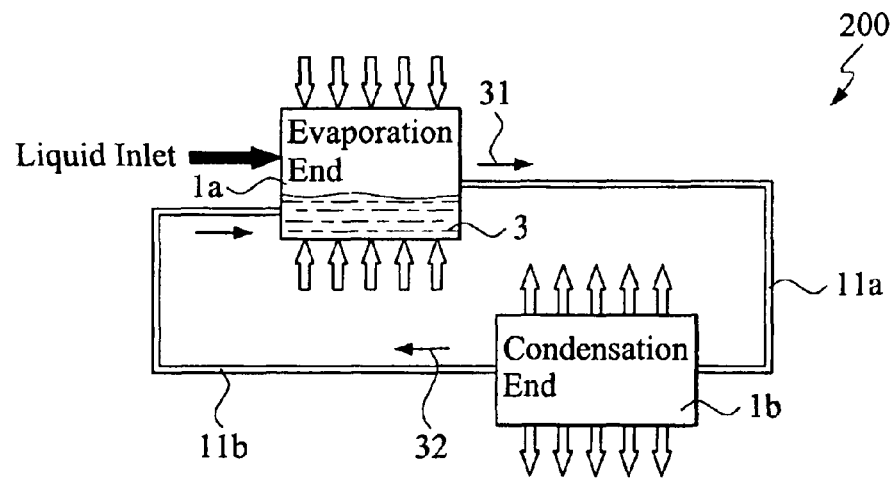
FIG. 2 schematically illustrates the operation of the conventional heat pipe.
Figure 3:
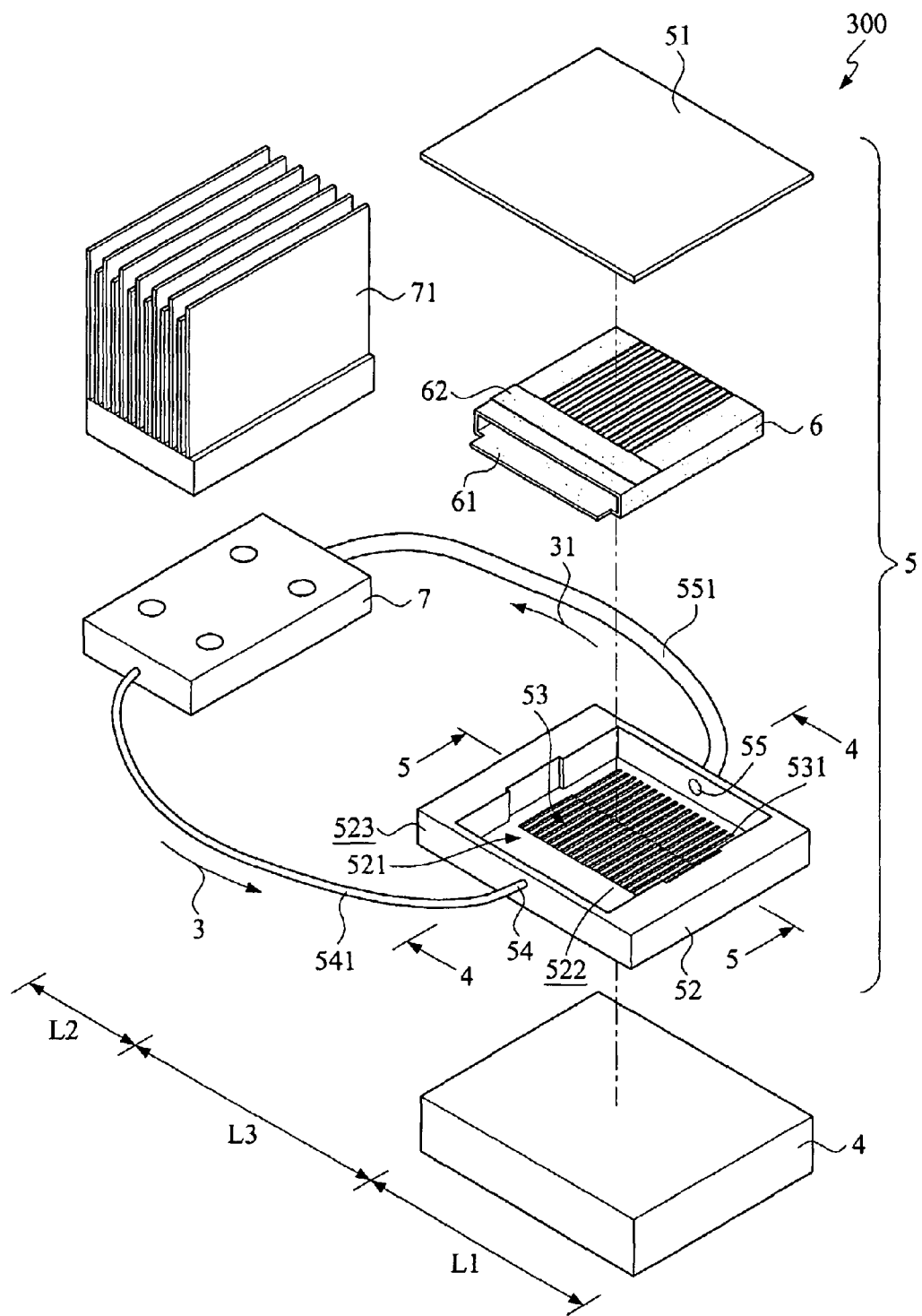
FIG. 3 is an exploded view of a loop heat pipe with flat evaporator constructed in accordance with an embodiment of the present invention.
Figure 4:
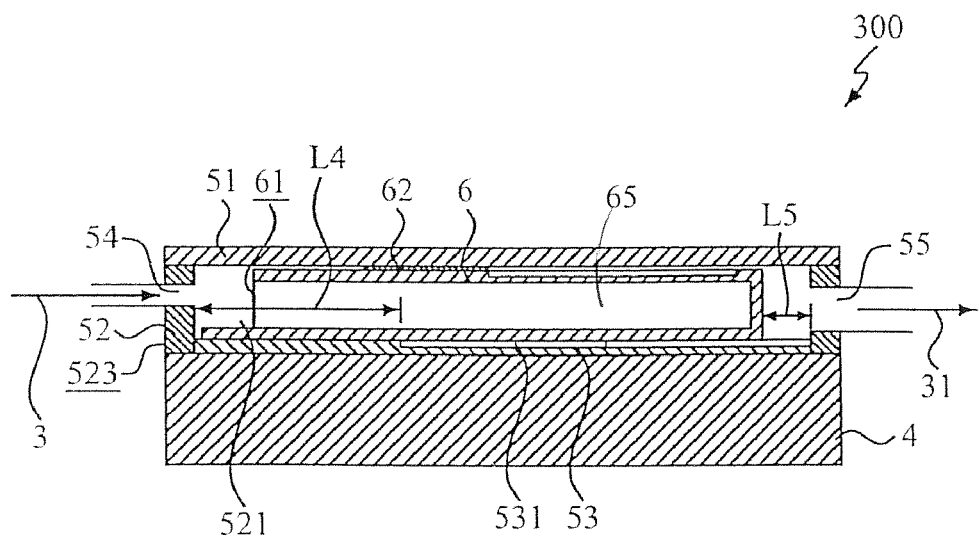
FIG. 4 is a cross-sectional view taken along line 4-4 of FIG. 3.
Figure 5:
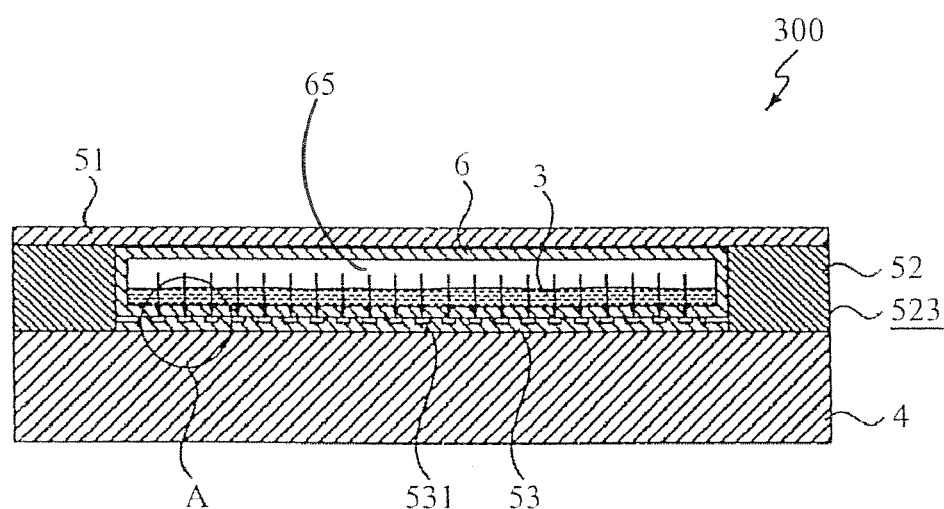
FIG. 5 is a cross-sectional view taken along line 5-5 of FIG. 3.

With reference to the drawings and in particular to FIGS. 3-5, which show, respectively, an exploded view of a loop heat pipe with flat evaporator constructed in accordance with the present invention and cross-sectional views taken along lines 4-4 and 5-5 of FIG. 3, the loop heat pipe of the present invention, generally designated with reference numeral 300, comprises an evaporation section L1, a condensation section L2, and a transportation section L3 connected between the evaporation section L1 and the condensation section L2.

The evaporation section L1 is arranged to contain a heat source 4 therein and also comprises an enclosed containment structure 5 disposed on the heat source 4. The enclosed containment structure 5 comprises a lid 51 and a container 52, defining there between an enclosed containment space 521 for receiving a working fluid 3. The enclosed containment space 521 comprises a channel structure 53, a capillary structure 6, a liquid inlet 54, and a gas outlet 55 substantially opposite to the liquid inlet 54. The channel structure 53 comprises a plurality of recessed channels 531, which are formed horizontally in a bottom 522 of the enclosed containment space 521 to be substantially parallel and equally spaced from each other. The capillary structure 6 is horizontally positioned in an offset manner with respect to and on the channel structure 53, as indicated by the space L5 between the capillary structure and the gas outlet 55, in FIG. 4. The liquid inlet 54, which is formed in a circumferential wall 523 of the container 52 is put in communication with a front side opening 61 of the capillary structure 6, while the gas outlet 55, which is formed in the circumferential wall 523 of the container 52 but is opposite to the liquid inlet 54, is put in communication with the channels 531 of the channel structure 53.

The transportation section L3 comprises a first conduit, serving as a gas passage 551, and a second conduit, serving as a liquid passage 541. The gas passage 551 is connected to the gas outlet 55 of the enclosed containment structure 5, while the liquid passage 541 is connected to the liquid inlet 54 of the enclosed containment structure 5.

The condensation section L2 comprises a condensing device 7, which is connected to the gas passage 551 of the transportation section L3 for cooling vapor 31 evaporating from the working fluid 3, which is in a liquid form, so as to convert the vapor 31 back into liquid form of the working fluid 3. On the side of the condensing device 7 that is opposite to the gas passage 551, the liquid passage 541 is connected for discharging the working fluid 3 that is condensed from the vapor 31 inside the condensing device 7.

Preferably, a heat dissipation fin module 71 is arranged on the condensing device 7 of the condensation section L2 to enhance heat dissipation so as to allow the condensing device 7 to operate in a more efficient way to cool/condense the vapor 31 that is conveyed to the condensing device 7 through the gas passage 551.

When an amount of working fluid 3 is filled into the enclosed containment space 521, heat from the heat source 4 in the evaporation section L1 heats and thus evaporates a portion of the working fluid 3 into vapor 31. The vapor 31 moves through the gas outlet 55 into the gas passage 551 and reaches the condensing device 7 of the condensation section L2 in which the vapor 31 is condensed and converted back to liquid form, becoming a portion of the working fluid 3. The condensed liquid of the working fluid 3 formed inside the condensing device 7 then flows through the liquid passage 541 back to the enclosed containment space 521. This process is repeated cyclically.

Figure 6:
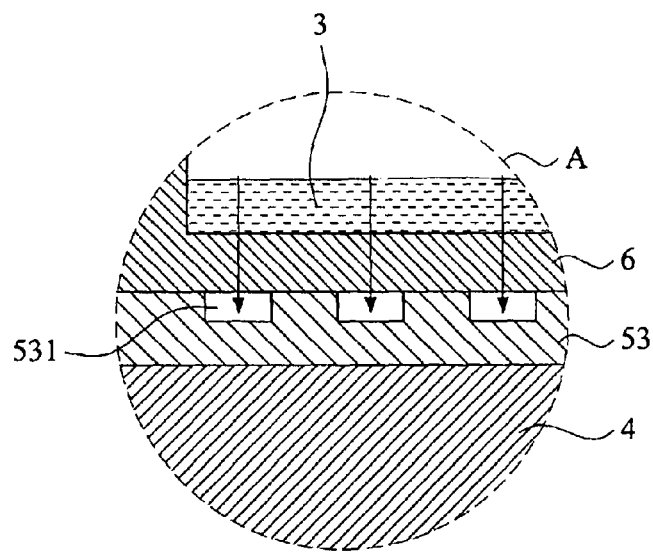
FIG. 6 is an enlarged view of a circled portion A of FIG. 5.

Also referring to FIG. 6, which is an enlarged view of a portion of the loop heat pipe with flat evaporator in accordance with the present invention, the capillary structure 6 is horizontally positioned on the channel structure 53 to guide the working fluid 3 that is formed by being condensed in the condensation section L2 and flows back through the liquid passage 541 back to the enclosed containment space 521. The capillarity effected by the capillary structure 6 guides the working fluid 3 that enters the enclosed containment space 521 through the liquid passage 541 into the channels 531 of the channel structure 53 in a substantially uniform manner. When the working fluid 3 is heated to evaporate again by the heat source 4, the evaporated vapor 31 is prevented from entering the liquid passage 541 from the channel structure 53.

The channel structure 53 may be provided with a single and flat channel 531. The channel 531 is still efficient in generating a high capillary driving force in capillary structure 6. Similarly, a plurality of channels may be formed at capillary structure 6. These channels are parallely spaced and arranged to align with the channels 531 of the channel structure 53 or at the interspaces between the channels 531 of the channel structure 53. Alternatively, a single channel is formed at capillary structure 6 superimposed on the channel structure 53 with multiple channels 531

Figure 7:
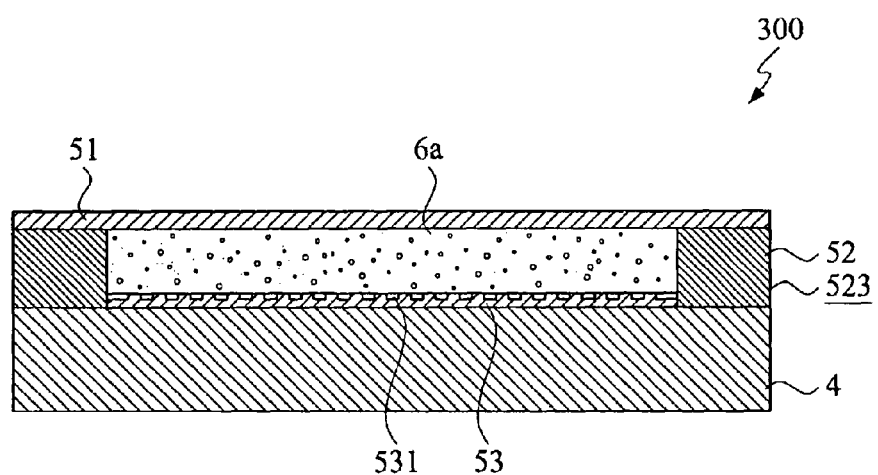
FIG. 7 is a cross-sectional view of a loop heat pipe of the present invention comprising a porous capillary structure.

Also referring to FIG. 7, which shows a cross-sectional view of a porous capillary structure that is embedded in the loop heat pipe of the present invention, in the embodiment the capillary structure that is adopted in the loop heat pipe of the present invention can be, as illustrated, alternately or additionally, a porous capillary structure 6a, which is similarly positioned on the channel structure 53. Thus, when the working fluid 3, which is formed by being condensed in the condensation section L2, flows into the enclosed container 52 and thus into the porous capillary structure 6a, the porous capillary structure 6a uniformly distributes the working fluid 3 to the channels 531 of the channel structure 53. Also, the porous capillary structure 6a blocks the evaporated vapor 31 of the working fluid 3 inside the channel 53 from moving therethrough and into the liquid passage 541. Apparently, the capillary structure can be made of a variety of material/substance that exhibits excellent or acceptable capillarity, such as lamination of metal meshes, lamination of non-metal meshes, diffusion-bonded metal meshes, sintered metal powders, sintered non-metal powders, cotton based fabric, metal material comprised of titanium or copper or metal mesh structure, non-metal material including ceramic material, plastics, epoxy resin, fiber, porous heat-resistant brick. With the particular structure of the capillary structure 6, a high capillary driving force is induced, which can tightly retain water molecules and effectively prevent reversed flow of vapor 31, ensuring that the vapor 31 may move forward in the desired direction into the gas passage 551.

Preferably, a barrier 62 is provided between the capillary structure 6 and the enclosed containment space 521, which is arranged atop the capillary structure 6 and between the capillary structure 6 and the lid 51 of the enclosed containment structure 5, and is located in proximity to and substantially perpendicular to the liquid inlet 54 that is formed in the circumferential wall 523 of the container 52, in order to prevent the vapor 3 present in the enclosed containment space 521 from entering the liquid passage 541.

By means of the plurality of channels 531 inside the enclosed containment space 521, the vapor 31 formed by the evaporation of the working fluid 3 by the heat source 4 can efficiently move out of the evaporation section L1 and enter the transportation section L3. The channels 531 are arranged/configured to effect balancing of pressure in guiding the vapor 31 into the gas passage 551 so that the vapor 31 can smoothly enter the gas passage 551 with more uniform pressure difference. Preferably, the channel structure 53 of the enclosed containment structure 5 is configured to have the channels 531 divided into a plurality of horizontal segments at predetermined distances. With the arrangement, the working fluid 3 evaporates quickly and generates a uniform pressure difference to drive the vapor 31 to flow to the gas passage 551. Also, the adjacent segments may be formed with different vertical dimensions such that a predetermined difference of altitude exists therebetween, thereby realizing a step-like configuration of the channels.

Further, a replenishment channel L4 is arranged inside within an internal chamber 65 of the capillary structure extending between the liquid inlet 54 and the channel structure 53 so that when working fluid 3 inside the channel structure 53 is evaporated by the heat from the heat source 4, the working fluid remaining in the replenishment channel L4 may flow into and thus replenish working fluid to the channel structure 53. In addition, when the heat source 4 is not present or is removed, the replenishment channel L4 provides a space for preservation of the working fluid 3.

Figure 8:
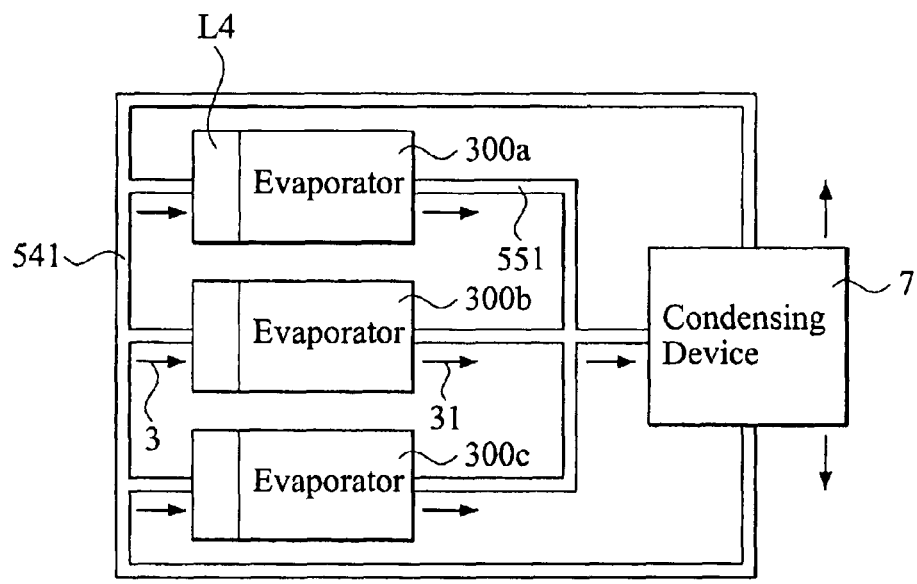
FIG. 8 is a schematic view of a loop heat pipe with flat evaporator constructed in accordance with a second embodiment of the present invention.
Figure 9:
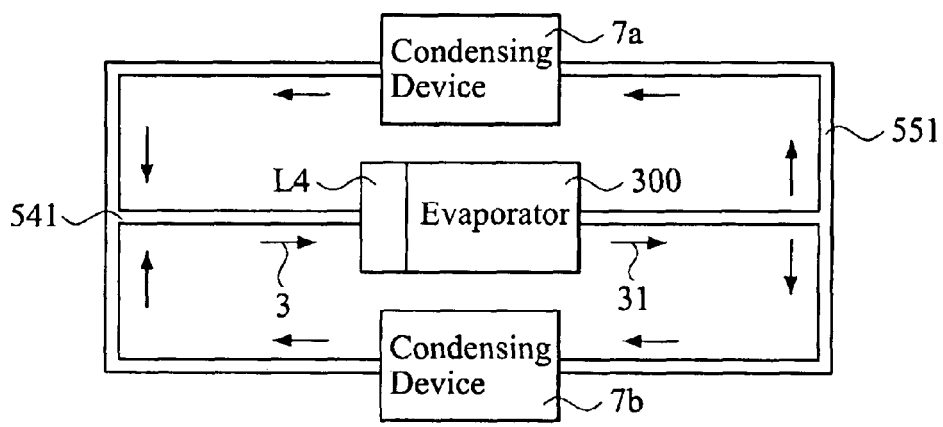
FIG. 9 is a schematic view of a loop heat pipe with flat evaporator constructed in accordance with a third embodiment of the present invention.

FIG. 8 shows a loop heat pipe with flat evaporator constructed in accordance with a second embodiment of the present invention and FIG. 9 shows a third embodiment of the loop heat pipe with flat evaporator of the present invention. The second embodiment of the loop heat pipe includes a plurality of evaporators 300a, 300b, 330 arranged in parallel to each other and connected to a condensing device 7. The evaporators 300a, 300b, 300c may be respectively positioned on different heat sources 4 to provide cooling to the different heat sources 4. In the third embodiment, the device of the present invention comprises a single evaporator 300 connected to two condensing devices 7a, 7b. This arrangement provides twice cooling effect by means of the two condensing devices 7a, 7b and can be used to replace the above-described single condensing device embodiment where a single condensing device 7 is used to effect cooling, which may not be sufficient for the associated heat source 4.

Figure 10:
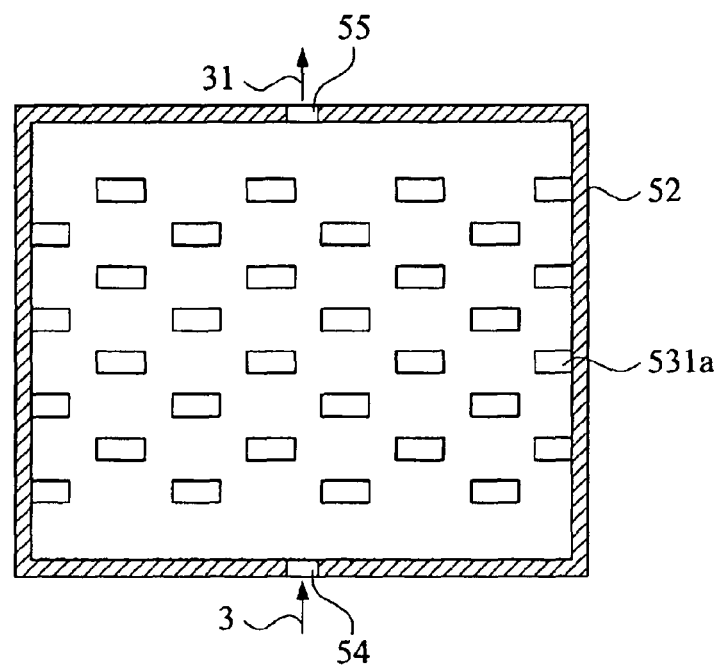
FIG. 10 is a schematic top plan view illustrating a channel structure of a loop heat pipe with flat evaporator constructed in accordance with a fourth embodiment of the present invention.

FIG. 10 a fourth embodiment of the loop heat pipe of the present invention, wherein the channel structure 53 comprises a plurality of raised portions or islands 531a, which are equally spaced in a first direction that, in the embodiment illustrated, is substantially parallel to the direction from the inlet 54 to the outlet 55, and are arranged in an alternate manner for adjacent rows of the raised portions 531a. The working fluid 3, which is filled into the enclosed containment space 521, is divided and guided by the raised portions 531 to uniformly distribute throughout the enclosed containment space 521 so as to effect uniform and enhanced evaporation of the working fluid 3.

It is apparent to those having ordinary skills in the art that enclosed containment structure 5 of the loop heat pipe of the present invention can be made of any material of excellent thermal conduction, such as metals including copper, aluminum, stainless steel, titanium or alloys thereof and non-metal material, including diamond. The material that makes the enclosed containment structure is selected to prevent chemical reaction with the working fluid and to provide regular operation of the device of the present invention. The conduits of the transportation section L3, which serve as the liquid and gas passages, can be made of metal or non-metal materials, such as copper pipes, aluminum pipes, stainless steel pipes, plastic tubes or other flexible metal or non-metal tubes or pipes. The condensation section L2 can be of any heat removing device, including any kinds of known heat dissipation devices.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A loop heat pipe with a flat evaporator for a heat source, comprising:
   an evaporation section, a condensation section, and a transportation section connected between the evaporation section and the condensation section;
   wherein the evaporation section comprises:
      an enclosed containment structure positionable on the heat source and comprising a lid and a container defining there between an enclosed containment space which receives a working fluid;
      a channel structure enabling uni-directional liquid and gas flow, comprising a plurality of longitudinally extended channels formed in a bottom of the enclosed containment space and arranged in a substantially parallel and equally spaced manner; wherein flow of liquid and gas is in the same direction;
      a liquid inlet formed in a circumferential wall of the container and arranged perpendicular to the channel structure;
      a gas outlet formed in the circumferential wall of the container and in communication with the channels of the channel structure, the gas outlet being opposite to the liquid inlet; and
      a single-phase capillary structure, arranged in the enclosed containment space and positioned in horizontally offset manner on the channel structure to be displaced from the heat source thereby, at least a portion of the channels remaining horizontally offset from the capillary structure to be in open communication with the gas outlet, the capillary structure having an internal chamber open on one end thereof to be in open communication with the liquid inlet and closed on an opposing end of the capillary structure for replenishment of the working fluid, a portion of the internal chamber between the inlet and the channel structure forming a replenishment channel;
   wherein the transportation section comprises:
      a gas passage connected to the gas outlet of the enclosed containment structure; and
      a liquid passage connected to the liquid inlet of the enclosed containment structure; and
   wherein the condensation section comprises:
      a condensing device connected to the gas passage for receiving and cooling vapor formed in the evaporation section by evaporation of the working fluid and converting the vapor into a liquid form of the working fluid, the condensing device being further connected to the liquid passage to allow the condensed liquid to flow away;
      wherein the working fluid received in the enclosed containment space is subject to heating by the heat source and evaporates into vapor, the vapor moving through the gas passage connected to the gas outlet to the condensing device of the condensation section where the vapor is cooled and converted back to the liquid form of the working fluid that is then guided through the liquid passage back to the enclosed containment space for next cycle; a barrier disposed between the capillary structure and the lid, the barrier extending in a direction transverse to the longitudinal direction of the plurality of channels.

2. The loop heat pipe as claimed in claim 1, wherein the channel structure of the enclosed containment space is divided at predetermined distances into a plurality of longitudinal aligned channel segments, longitudinally adjacent segments having a difference of altitude there between.

3. The loop heat pipe as claimed in claim 1, wherein the capillary structure of the enclosed containment structure comprises a structure selected from a group consisting of lamination of metal meshes, lamination of non-metal meshes, diffusion-bonded metal meshes, and cotton based fabric.

4. The loop heat pipe as claimed in claim 1 further comprising a heat dissipation fin module arranged on the condensing device of the condensation section.

5. The loop heat pipe as claimed in claim 1, wherein the capillary structure includes a plurality of channels formed in an upper surface thereof in parallel spaced relation to provide flow of liquid and gas in a direction in common with said plurality of channels formed in a bottom of the enclosed containment space, the evaporation section further comprising a barrier provided between the lid of the enclosed containment structure and the upper surface of the capillary structure adjacent to the channels formed therein and in a transverse direction with respect thereto.

6. A flat evaporator adapted to use in a loop heat pipe that comprises an evaporation section, a condensation section, and a transportation section connected between the evaporation section and the condensation section, the evaporator comprising:

an enclosed containment structure adapted to be positioned on a heat source and comprising a lid and a container defining there between an enclosed containment space which receives a working fluid and comprises:
- a first channel structure enabling uni-directional liquid and gas flow, comprising a plurality of longitudinally extended first channels formed in a bottom of the enclosed containment space and arranged in a substantially parallel and equally spaced manner; wherein flow of liquid and gas is in the same direction;
- a single-phase capillary structure, arranged in the enclosed containment space and overlaying the first channel structure, the capillary structure being positioned in horizontally offset manner on the first channel structure to be displaced from the heat source thereby, the capillary structure having a second channel structure formed therein, the second channel structure including a plurality of longitudinally extended second channels formed in an upper surface of the capillary structure in parallel spaced relation to provide flow of liquid and gas in a direction in common with the plurality of the capillary structure having an internal chamber open on one end thereof to be in open communication with the liquid inlet and closed on an opposing end of the capillary structure for replenishment of the working fluid, a portion of the internal chamber between the inlet and the channel structure forming a replenishment channel;
- a liquid inlet formed in a circumferential wall of the container and in communication with the capillary structure;
- a gas outlet formed in the circumferential wall of the container and in communication with the first channels of the first channel structure and the second channels of the second channel structure, the gas outlet being opposite to the liquid inlet, at least a portion of the first channels remaining horizontally offset from the capillary structure to be in open communication with the gas outlet; and
- a barrier disposed between the capillary structure and the lid and being adjacent to the second channel structure, the barrier extending in a direction transverse to the longitudinal direction of the plurality of second channels.

7. The flat evaporator as claimed in claim 6, wherein the channel structure of the enclosed containment space is divided at predetermined distances into a plurality of longitudinally aligned channel segments, longitudinally adjacent segments having a difference of altitude there between.

8. The flat evaporator as claimed in claim 6, wherein the capillary structure of the enclosed containment structure comprises a structure selected from a group consisting of lamination of metal meshes, lamination of non-metal meshes, diffusion-bonded metal meshes, and cotton based fabric.

* * * * *